United States Patent
Rouphael

(10) Patent No.: US 7,570,709 B2
(45) Date of Patent: Aug. 4, 2009

(54) AUTOMATIC TRANSMIT POWER CONTROL LOOP WITH MODULATION AVERAGING

(75) Inventor: Antoine J. Rouphael, Escondido, CA (US)

(73) Assignee: Siemens Aktiengesellschaft, Munich (DE)

( * ) Notice: Subject to any disclaimer, the term of this patent is extended or adjusted under 35 U.S.C. 154(b) by 735 days.

(21) Appl. No.: 09/952,346

(22) Filed: Sep. 14, 2001

(65) Prior Publication Data

US 2002/0154708 A1  Oct. 24, 2002

Related U.S. Application Data

(60) Provisional application No. 60/274,555, filed on Mar. 8, 2001.

(51) Int. Cl.
   *H04L 25/03* (2006.01)
(52) U.S. Cl. .................................................. 375/297
(58) Field of Classification Search ............... 375/148, 375/296–297, 344–345, 318, 335, 337, 342, 375/135, 146, 295; 370/318, 335, 337, 342, 370/455; 455/69, 522, 526, 103, 127.1, 116, 455/67.11, 423, 24, 91, 114.2, 114.3, 127.2, 455/127.3; 330/279, 290, 252, 254, 278
   See application file for complete search history.

(56) References Cited

U.S. PATENT DOCUMENTS

| | | | | |
|---|---|---|---|---|
| 5,170,495 | A * | 12/1992 | McNicol et al. ............. | 455/116 |
| 5,222,104 | A * | 6/1993 | Medendorp .................. | 375/308 |
| 5,452,473 | A * | 9/1995 | Weiland et al. .............. | 455/88 |
| 5,631,930 | A * | 5/1997 | Sasaki ........................ | 375/296 |
| 5,648,955 | A | 7/1997 | Jensen et al. ................ | 370/252 |
| 5,655,220 | A * | 8/1997 | Weiland et al. .............. | 455/69 |
| 5,732,334 | A * | 3/1998 | Miyake ....................... | 455/126 |
| 5,752,172 | A * | 5/1998 | Matero ....................... | 455/127.3 |
| 5,946,346 | A * | 8/1999 | Ahmed et al. ............... | 375/219 |
| 5,974,093 | A * | 10/1999 | Lee ............................ | 375/297 |
| 6,038,432 | A * | 3/2000 | Onoda ....................... | 455/127.2 |
| 6,057,732 | A * | 5/2000 | Morishita ................... | 330/129 |
| 6,101,179 | A | 8/2000 | Soliman ..................... | 370/342 |
| 6,173,160 | B1 * | 1/2001 | Liimatainen ............. | 455/67.11 |
| 6,188,678 | B1 | 2/2001 | Prescott ...................... | 370/318 |
| 6,230,023 | B1 | 5/2001 | Slanina ...................... | 455/522 |
| 6,286,994 | B1 * | 9/2001 | Boesel et al. ............... | 374/146 |

(Continued)

OTHER PUBLICATIONS

Gunnarsson et al., Power Control in Cellular Systems Subject to Constraints and Time Delays, Nov. 8-12, 1998, Global Telecommunications Conference, vol. 6, pp. 3645-3650.*

*Primary Examiner*—Tesfaldet Bocure
*Assistant Examiner*—Lawrence B Williams

(57) ABSTRACT

A telecommunications device includes an improved transmit power control loop. The transmit power control loop receives an output power measurement from a power amplifier at a transmitter output. The transmit power control loop also averages and samples an input power. The sampled power is provided to a calibration table, which produces a corresponding corrected Instantaneous output power. The instantaneous output power is then compared with the sampled output power. A difference between the instantaneous output power and the measured output power is then summed with the averaged power to provide a correction figure, used to adjust the set power. A running sum filter may be used to filter the resulting corrected power signal. The resulting average power adjustment is then used to adjust the gain of various power amplifiers in the transmit path.

19 Claims, 3 Drawing Sheets

U.S. PATENT DOCUMENTS

| | | | |
|---|---|---|---|
| 6,324,387 B1 * | 11/2001 | Kamgar et al. | 455/234.1 |
| 6,330,455 B1 * | 12/2001 | Ichihara | 455/522 |
| 6,396,879 B1 * | 5/2002 | Yoshimura et al. | 375/297 |
| 6,437,641 B1 * | 8/2002 | Bar-David | 330/10 |
| 6,463,264 B1 * | 10/2002 | Obara | 455/127.2 |
| 6,498,925 B1 * | 12/2002 | Tauchi | 455/115.1 |
| 6,519,293 B1 * | 2/2003 | Miyake | 375/297 |
| 6,553,018 B1 * | 4/2003 | Ichihara | 370/342 |
| 6,580,919 B1 * | 6/2003 | Saito | 455/522 |
| 6,591,089 B1 * | 7/2003 | Ichihara | 455/115.3 |
| 6,597,923 B1 * | 7/2003 | Vanghi et al. | 455/522 |
| 6,628,732 B1 * | 9/2003 | Takaki | 375/345 |
| 6,633,766 B1 * | 10/2003 | van der Pol | 455/522 |
| 6,701,135 B2 * | 3/2004 | Posti et al. | 455/103 |
| 6,711,388 B1 * | 3/2004 | Neitiniemi | 455/127.1 |
| 6,741,867 B1 * | 5/2004 | Tetsuya | 455/522 |
| 6,788,744 B1 * | 9/2004 | Hirama | 375/297 |
| 6,795,712 B1 * | 9/2004 | Vakilian et al. | 455/522 |
| 7,148,749 B2 * | 12/2006 | Rahman et al. | 330/279 |
| 2001/0003434 A1 * | 6/2001 | Mu et al. | 330/207 P |
| 2001/0006887 A1 * | 7/2001 | Liimatainen | 455/67.1 |
| 2002/0119797 A1 * | 8/2002 | Woodhead et al. | 455/522 |
| 2002/0122397 A1 * | 9/2002 | Ling et al. | 370/335 |
| 2002/0131521 A1 * | 9/2002 | Barak et al. | 375/297 |
| 2004/0166885 A1 * | 8/2004 | Mohsen et al. | 455/522 |

* cited by examiner

AUTOMATIC TRANSMIT POWER CONTROL LOOP WITH MODULATION AVERAGING

CROSS REFERENCE TO RELATED APPLICATIONS

The present application claims priority from U.S. Provisional Application Ser. No. 60/274,555, filed Mar. 8, 2001, which is hereby incorporated by reference in its entirety as if fully set forth herein.

BACKGROUND OF THE INVENTION

The present invention relates to telecommunications devices and, in particular, to an improved automatic power control loop for a wireless telecommunications transmitter.

The Federal Communications Commission (FCC) regulates the use of the radio frequency (RF) spectrum in the United States. Users of allocated handwidth of the RF spectrum must take measures to ensure that radiated emissions inside and outside the allocated bandwith are maintained within acceptable levels to avoid interfering with other users' operating in the same or other bandwidths. For example, users of cellular telephone systems must ensure that they are compliant with the level of radiated emissions allowable inside or outside the channels they have been assigned.

Cellular telephones such as, for example, CDMA (code division multiple access) or TDMA (time division multiple access ) cellular telephones, include power amplifiers in the transmitter in which the power amplifier can be driven beyond a point where acceptable out of channel emissions are maintained. This is primarily due to the increased distortion output levels of the power amplifier at high powers.

Thus, regulating the transmitted signal power can reduce the amount of interference and spectral regrowth to a desired level. Certain wireless telecommunications transmitters, such as those used for cellular telephony, employ a transmit power control loop to regulate the transmitted signal power. In the mobile radio standard IS-95, for example, poorly regulated transmit power at the wireless terminal can lead to near-far effect at the base station demodulator, thus degrading the performance of the system. Similarly, in IS-136, drift in the transmit power loop can cause additional interference in the uplink channel, as well as spectral regrowth.

Regulating the transmitted signal power requires measurement or estimation of the actual transmitted signal power. However, this can be difficult, because modulation schemes such as DQPSK introduce signal power variations on the order of several decibels. On the digital side, this is due largely to the use of a square root raised cosine filter for pulse shaping as is required by the IS-136 standard, for example. FIG. 1 illustrates an instantaneous transmit power fluctuates between −4 and −22 dB for eight times overshaping. FIG. 2 illustrates the corresponding signal constellation. Again, there is considerable fluctuation about the points of interest.

Because of this relatively wide fluctuation in the transmit power, sampling the power output one time is not sufficient for fast and accurate convergence of the APO loop. One solution to this problem has been to perform signal power averaging via an analog RC filter or in the digital domain, by digitizing the output power. This latter method requires fast analog-to-digital converters. Either method, however, has proven to be expensive in terms of performance, accuracy, and board space. Consequently, many manufactures have settled on sampling the power only once, thus avoiding the averaging process. However, this can lead to inaccuracy in estimating the transmitted signal power and slowing the APC loop's convergence time considerably.

As such, there is a need for an improved transmit power control loop. There is additionally a need for an improved system and method for estimating transmit signal power.

SUMMARY OF THE INVENTION

These and other drawbacks in the prior art are overcome in large part by a system and method according to the present invention.

A coupler measures the instantaneous power at a power amplifier. A sampler takes an instantaneous sample of the power at the output of the raised cosine filters. A power adjustment unit then takes the sampler output and the coupler output and adjusts the discrete average power. The resulting corrected power is then used to adjust the set power level.

According to an embodiment, the present invention provides a power control loop. The power control loop is adapted to receive a coupler measurement of a power level. The power control loop includes a sampler to sample power and a power adjustment unit adapted to adjust a power level based on a sampler output of power at an output of one or more transmit filters and the coupler measurement.

A method according to an embodiment of the invention includes measuring the transmit power at an output power amplifier and sampling the instantaneous power at the output of raised cosine filters. The method further includes adjusting a power level based on the measuring and sampling. In a specific embodiment, a power adjustment figure is obtained and used to scale the discrete average power, the adjusted power signal is then compared to a set power figure, the error is sent to a running sum filter, and the output of the running sum filter adjusts the power amplifier.

A better understanding of these and other specific embodiments of the invention is obtained when the following detailed description is considered in conjunction with the following drawings.

DETAILED DESCRIPTION OF EMBODIMENTS OF THE INVENTION

A telecommunications device according to an embodiment of the present invention includes an improved transmit power control loop. The transmit power control loop receives an output power measurement from a power amplifier at a transmitter output. The transmit power control loop also averages and samples an input power. The sampled power is provided to a calibration table, which produces a corresponding corrected instantaneous output power. The instantaneous output power is then compared with the sampled output power. A difference between the instantaneous output power and the measured out put power is then summed with the averaged power to provide a correction figure, used to adjust the set power. A running sum filter may be used to filter the resulting corrected power signal. The resulting average power adjustment is then used to adjust the gain of various power amplifiers in the transmit path.

Figure 1:
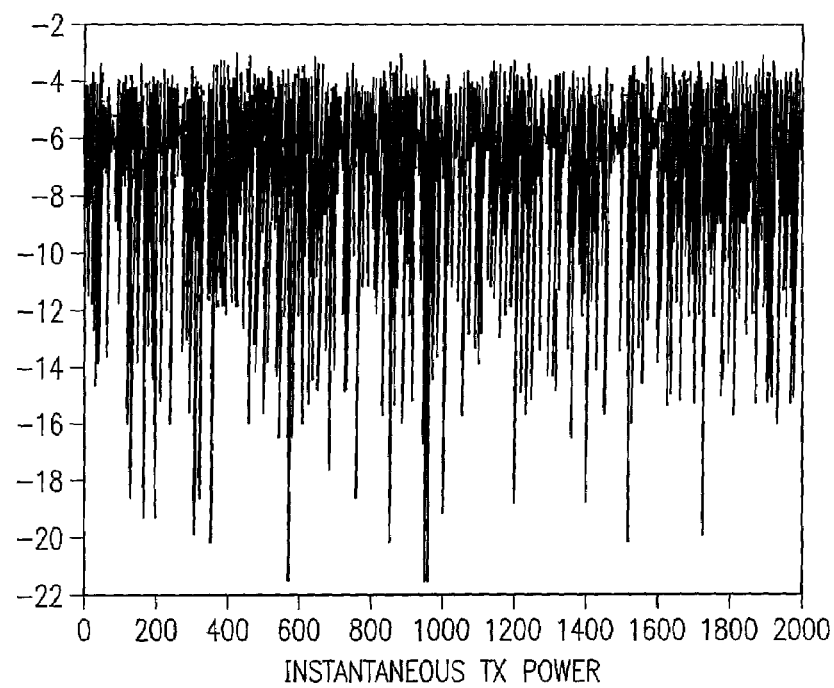
FIG. 1 is a diagram of instantaneous transmit signal power.
Figure 2:
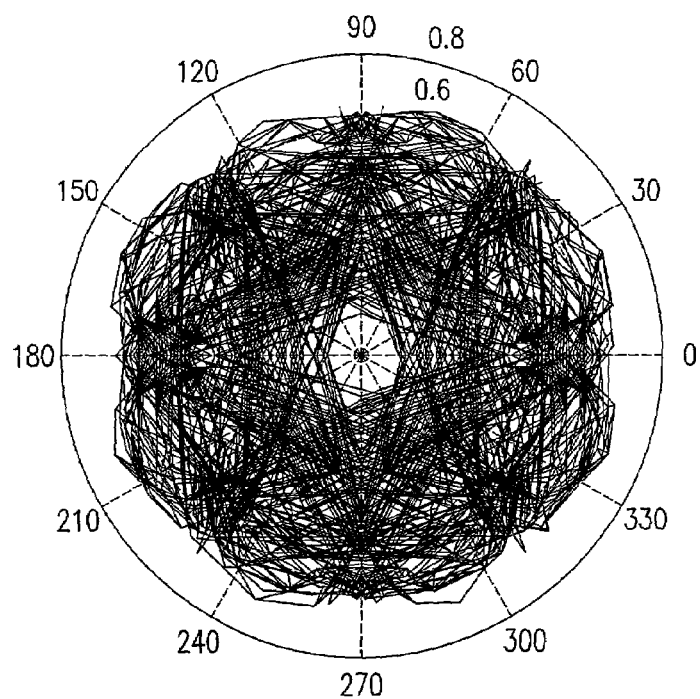
FIG. 2 is a signal constellation corresponding to the transmit signal power of FIG. 1
Figure 3:
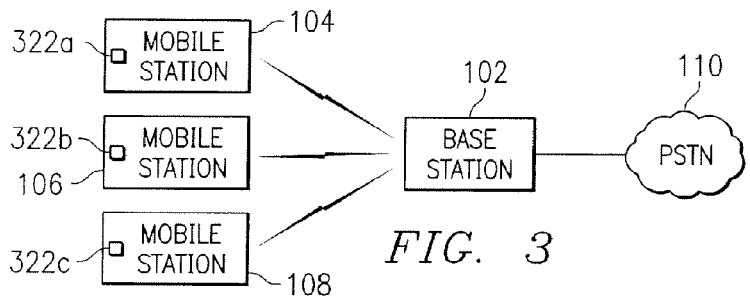
FIG. 3 is a diagram illustrating a telecommunications system according to an embodiment of the present invention

Turning now to the drawings and, particular attention to FIG. 3, a diagram of a telecommunication system 100 according to an embodiment of the present invention is shown. The system 100 includes at least one base station 102 serving a particular geographic region and a plurality of mobile stations 104, 106, 108 which may move in and out of the region. The base station 102 couples the mobile stations of the public switched telephone network (PSTN) 110. In addition, the mobile stations 104, 106, 108 include transmit power control units 322a-322c, respectively according to embodiments of the present invention. More particularly, as will be explained in greater detail below, a coupler measurement of a transmit output power is used, along with an instantaneous sampling of an input power, to adjust an average power which, in turn, is used to set transmit path amplifiers. The system 100 may be an IS-136 or IS-95 or GSM based telecommunications network, for example.

Figure 4:
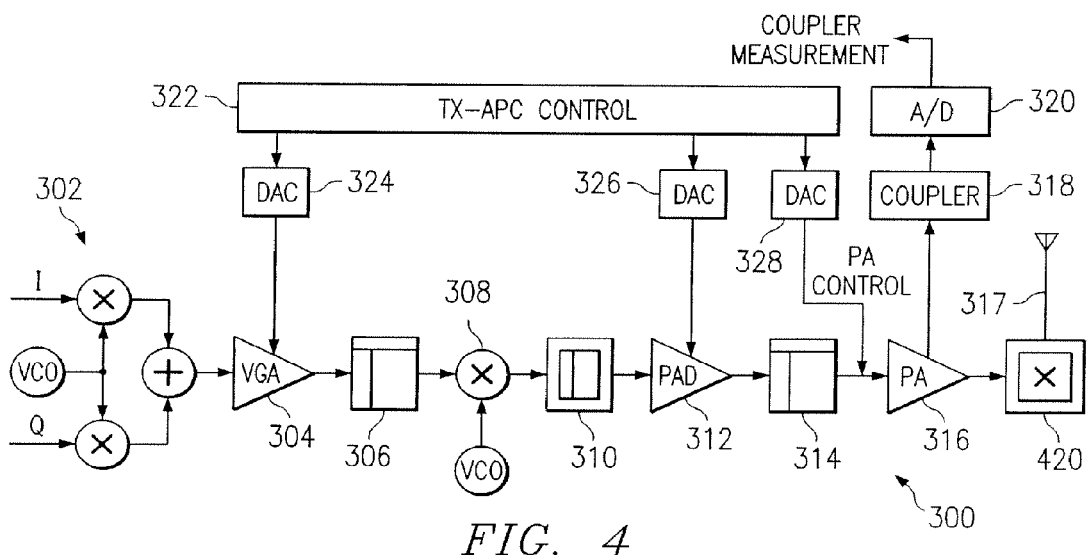
FIG. 4 is a diagram of an exemplary baseband RF transmitter according to an embodiment of the present invention.

Turning now to FIG. 4, a diagram illustrating an exemplary transmitter 300, typically present in the mobile stations 104, 106, 108, according to an embodiment of the invention is shown. The RF transmitter 300 includes an intermediate frequency (IP) modulator 302 for modulating the in-phase (I) and quadrature (Q) signals. The signal is then amplified using the variable gain amplifier (VGA) 304. The signal is then mixed to RF using RF modulator 308. The signal may be provided to a power amplifier driver 312. The output of the power amplifier driver 312 is provided to the power amplifier 316. The output of the power amplifier 316 is then transmitted via antenna 317. In addition, various transmit filters 306, 310, 314 may be provided.

A coupler 318 estimates the transmit power at the power amplifier 316. A slow A/D converter 320 sends the coupler measurement back to the APC loop of the APC control unit 322 (FIG. 5) for further processing, as will be explained in greater detail below. The transmit APC control the gain of VGA 304, power amplifier driver 312, and power amplifier 316. The APC control loop that utilizes the coupler measurement signal is illustrated in greater detail in FIG. 5.

Figure 5:
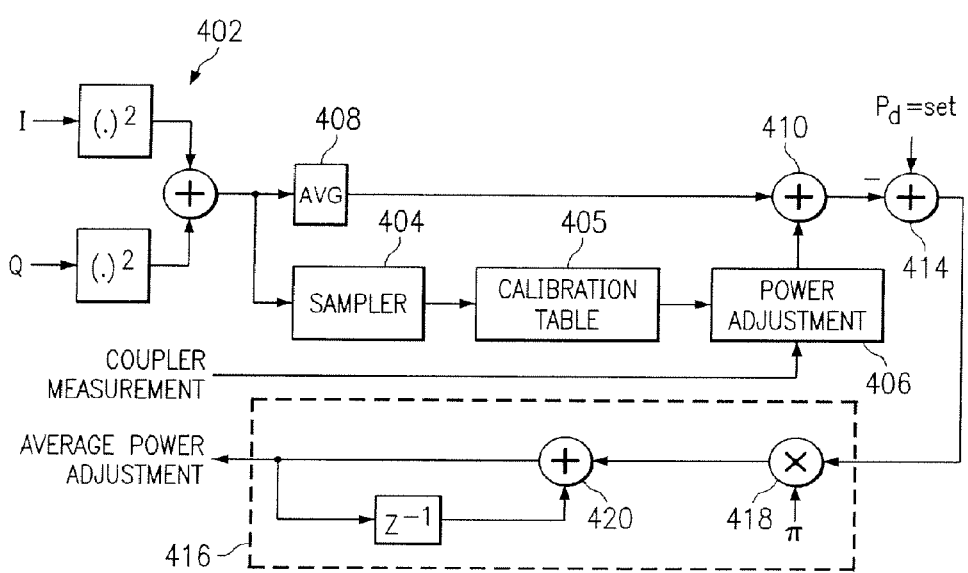
FIG. 5 is a diagram of an exemplary APC loop according to an implementation of the invention.

In particular, turning now to FIG. 5, a diagram of an APC loop according to an implementation of the present invention is shown. The in-phase (I) an quadrature (Q) signals are squared and summed in power unit 402 to obtain an instantaneous power signal. The instantaneous power signal is then provided to an averaging block 408 and a sampler 404. The averaging block 408 averages the instantaneous power signal over a predetermined period, such as a frame, to obtain an average power signal. According to one embodiment of the present invention, the averaging block implements the following:

$$S_I = \frac{1}{M} \sum_{n=I}^{I+M} (I^2(n) + Q^2(n))$$

where M is the number of samples involved in the averaging process (e.g., the number of samples in a frame), I is the Ith frame, and S is the average power after the digital filters at the input to the DACs.

The sampler 404 samples the instantaneous power at the same time the coupler 318 samples the output of the power amplifier (PA) 316. At the instant that the coupler 318-ADC 320 samples the PS output, the sampler 404 will present the equivalent instantaneous power measurement of the corresponding digital sample. The measured instantaneous power is then provided to the calibration table 405.

The calibration table 405 converts the sampled input power into an output power figure. The calibration table values may be obtained at the factory by feeding a signal with a known signal power into the transmit RF block and measuring the output power at the antenna 317 (FIG. 3). A one-to-one correspondence is then made between the input power and the measured output power.

The calibration output from the calibration table 405 is provided to a power adjustment unit 406. The power adjustment unit 406 also receives the coupler measurement from the coupler 318-ADC 320 (FIG. 3). The power adjustment block 406 compares the two values and produces an output reflecting the difference between the two. The output of the power adjustment unit 406 is added to the average power from the averaging unit 408, thus correcting the average power figure.

The output of the summation unit 410 is then used to adjust the set power $P_d$ using the summation circuit 414. The resulting output is then supplied to a loop or running sum filter 416, which includes a scaling factor π. The scaling factor π may be arbitrarily chosen depending on the desired speed of the loop. A large π causes the loop to converge to the desired value faster, but with increased noise on the loop output. A small π will take longer to coverage, nut with noise effecdt being minimal. The running sum acts as an integrator over an infinite period of time. That is, it computes the long term mean of the input. It is noted, however, that other types of filters can be used.

Figure 6:
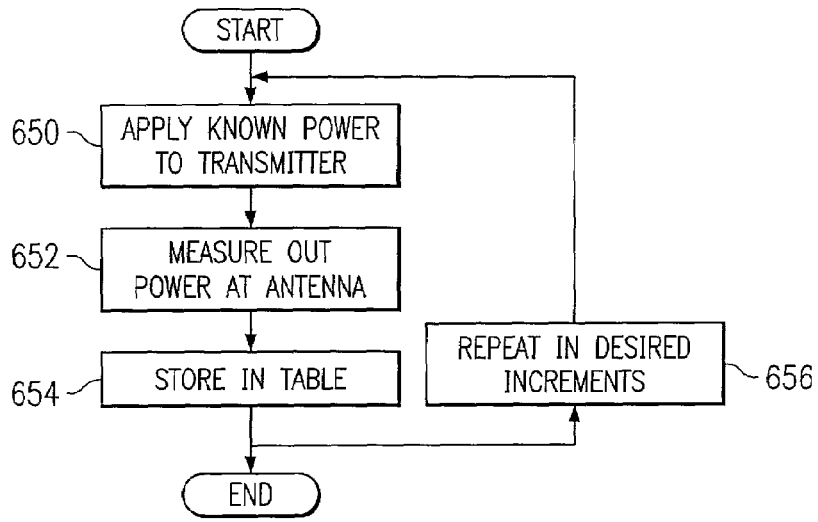
FIG. 6 is a flowchart illustrating operation of an embodiment of the invention.

FIG. 6 is a flowchart illustrating operation of an embodiment of the present invention. In particular, FIG. 6 illustrates a procedure for generating the calibration table values. In step 650, a known input power is applied to the transmitter. In step 652, the output power at the antenna is measured, e.g., at the coupler 318. In step 654, the output power value is stored in the calibration table. In step 656, the process of repeated in desired increments of the input power.

Figure 7:
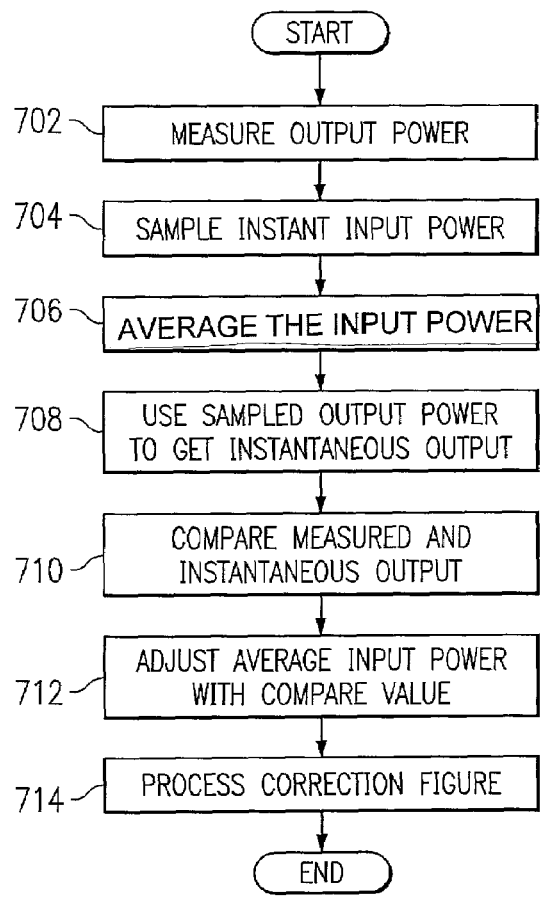
FIG. 7 is a flowchart illustrating operation of an embodiment of the invention.

FIG. 7 illustrates a process for adjusting transmitter power according to an embodiment of the present invention. In step 702, the output power is measured by the coupler 318. In step 704, the instantaneous input power is sampled by sampler 404. In step 706, the average input power is measured, over a predetermined time period. In step 708, the sampled instantaneous power is used to obtain a value from the calibration table 405. In step 710, the measured output power is compared with the calibration table output power value. In step 712, the compared value is used to adjust the average input power. Finally, in step 714, the set power is adjusted accordingly and the corrected set power may be further processed before being used as the correction figure to set the gain of the transmit amplifiers.

The invention described in the above detailed description is not intended to be limited to the specific form set forth herein, but is intended to cover such alternatives, modifications and equivalents as can reasonably be included within the spirit and scope of the appended claims.

What is claimed is:

1. A system, comprising:
   a transmitter including a variable gain amplifier and a power amplifier; and
   a power control loop adapted to receive a coupler measurement of a power level at an output of said power amplifier, said power control loop including a sampler to sample actual instantaneous transmit power at an input of the transmitter and further including a power adjustment unit adapted to adjust an average power level based on a sampler output and said coupler measurement and an average of said instantaneous transmit power, wherein the sampler output and said coupler measurement occur substantially simultaneously.

2. A system in accordance with claim 1, wherein said power control loop is further adapted to adjust a set power value based on an output of said power adjustment unit.

3. A system in accordance with claim 2, wherein said power control loop further includes a loop filter.

4. A system in accordance with claim 2, wherein an output of said power control loop is configured to control a setting of said variable gain amplifier.

5. A method for use in a telecommunications transmitter, comprising:
sampling an actual instantaneous transmit power level at an input of the transmitter;
measuring transmit power at a power amplifier at an output of the transmitter; and
adjusting an average power level based on said sampling and said measuring and an averaging of said actual instantaneous transmit power;
wherein the sampling and said measuring occur substantially simultaneously.

6. A method in accordance with claim 5, further comprising adjusting a set power level based on said sampling and said measuring.

7. A method in accordance with claim 5, further comprising filtering an adjusted value of said set power level using a running sum filter.

8. A method in accordance with claim 7, further comprising controlling a setting of a variable gain amplifier using said adjusted value.

9. A radio transmitter system, comprising:
a transmitter having a variable gain amplifier and a power amplifier; and
means for adjusting a gain level of said variable gain amplifier based on a power measurement at said power amplifier at an output of a transmitter and a sample of actual power output at an input to the transmitter and an average over a frame of said actual power output wherein the power measurement and the sample occur substantially simultaneously.

10. A radio transmitter system in accordance with claim 9, wherein said adjusting means is adapted to adjust a set power level.

11. A radio transmitter system in accordance with claim 10, further comprising a running sum filter for filtering an adjusted set power level.

12. A method, comprising:
providing a transmitter including a variable gain amplifier and a power amplifier; and
providing a power control loop, adapted to receive a coupler measurement of a power level at said power amplifier at an output of the transmitter, said power control loop including a sampler to sample actual instantaneous transmit power at an input of the transmitter substantially simultaneously with the coupler measurement and further including a power adjustment unit adapted to adjust an average power level based on said sampler output and said coupler measurement and an average of said actual instantaneous transmit power.

13. A method in accordance with claim 12, wherein said power control loop is further adapted to adjust a set power value based on an output of said power adjustment unit.

14. A method in accordance with claim 13, wherein said power control loop further includes a running sum filter.

15. A method in accordance with claim 14, wherein an output of said power control loop is configured to control a setting of said variable gain amplifier.

16. A power control loop adapted to receive a coupler measurement of a power level at a power amplifier at an output of a transmitter, said power control loop including a sampler to sample power and further including a power adjustment unit adapted to adjust a power level based on a sampler output of actual instantaneous transmit power at an output of one or more transmit filters and said coupler measurement and a frame average of the actual instantaneous transmit power, wherein a coupler measurement and the sampler output are taken substantially simultaneously.

17. A power control loop in accordance with claim 16, further adapted to adjust a set power value based on an output of said power adjustment unit.

18. A system, comprising:
a transmitter including a variable gain amplifier and a power amplifier; and
a power control loop adapted to receive a coupler measurement of an output transmit power level, said power control loop including a sampler to sample actual input transmit power and further including a power adjustment unit adapted to adjust a power level based on said sampler output and said coupler measurement and an average of said actual input transmit power, wherein said sampler output and said coupler measurement are taken substantially simultaneously.

19. A system, comprising:
a transmitter including a variable gain amplifier and a power amplifier; and
a power control loop adapted to receive a coupler measurement of a power level at an output of said power amplifier, said power control loop including a sampler to sample actual instantaneous transmit power at an input of the transmitter and further including a power adjustment unit adapted to adjust a power level based on a sampler output and said coupler measurement, the power control loop further configured to average the instantaneous transmit power over a predetermined period wherein the sampler output and said coupler measurement are used to correct the average instantaneous transmit power and adjust a set power.

* * * * *